United States Patent [19]

Ruggiero et al.

[11] Patent Number: 5,046,971
[45] Date of Patent: Sep. 10, 1991

[54] TERMINAL PINS FOR FLEXIBLE CIRCUITS

[75] Inventors: Murray A. Ruggiero, East Haven; Kin S. Chang, Meriden; George A. Anderson, Old Lyme; Robert T. Brooker, Watertown, all of Conn.

[73] Assignee: Olin Corporation, New Haven, Conn.

[21] Appl. No.: 561,222

[22] Filed: Jul. 30, 1990

Related U.S. Application Data

[63] Continuation of Ser. No. 284,622, Dec. 14, 1988, abandoned.

[51] Int. Cl.$^5$ .......................... H01R 9/09; H01R 9/16
[52] U.S. Cl. ...................................... 439/741; 29/843; 29/844
[58] Field of Search ..................... 439/55, 78, 81–84, 439/741, 870, 876; 29/837–845

[56] References Cited

U.S. PATENT DOCUMENTS

| | | | |
|---|---|---|---|
| 2,040,674 | 5/1936 | Severance et al. | 29/844 |
| 3,980,367 | 9/1976 | Laserson et al. | 439/84 |
| 4,420,877 | 12/1983 | McKenzie | 29/843 |
| 4,677,526 | 6/1987 | Muehling | 361/386 |
| 4,724,472 | 2/1988 | Sugimoto et al. | 357/74 |
| 4,812,130 | 3/1989 | Altenschulte et al. | 439/84 |

OTHER PUBLICATIONS

Tornos Bechler, Product Literature for Tor 4 for Double Headstock Swiss Type Automatic Lathe.
UTI Uniform Tubes, Inc. Product Literature.
Mill-Max Manufacturing Corporation Product Literature guide, pp. 25-36 entitled "Printed Circuit Pins"; publ. 1985.
Branson Ultrasonic Plastics Assembly Product Literature, p. 3.

Primary Examiner—Neil Abrams
Attorney, Agent, or Firm—Gregory S. Rosenblatt; Paul Weinstein

[57] ABSTRACT

The present invention relates to a terminal pin for electronic circuitry. The terminal pin includes an axial passageway. Various processes for electrically connecting the pin to the circuit are provided. The processes include riveting, welding and soldering. The axial passageway aids in the control of metal deformation to improve the bond between the pin and the circuitry.

8 Claims, 4 Drawing Sheets

TERMINAL PINS FOR FLEXIBLE CIRCUITS

This application is a continuation of U.S. patent application Ser. No. 284,622 filed Dec. 14, 1988 (now abandoned).

This application relates to U.S. Pat. No. 4,965,227 which is a Continuation-In-Part of U.S. Pat. No. 4,816,426 which in turn is a Continuation-In-Part of U.S. patent application Ser. No. 16,614, filed Feb. 19, 1987 (now abandoned).

While the invention is subject to a wide range of applications, it particularly relates to terminal pins for flexible or rigid electronic circuits and processes for bonding the terminal pins to the circuit. In particular, the invention relates to processes for the bonding of a large number of terminal pins to manufacture high pin density plastic pin grid arrays.

U.S. Pat. No. 4,816,426 discloses a process for the assembly of a plastic pin grid array (PPGA). The process includes the step of inserting terminal pins through a plurality of apertures formed in an interconnect tape prior to molding a polymer resin about the pins and tape. Conductive circuit patterns on the tape form circuitry electrically connecting the terminal pins to an electronic device, such as a semiconductor integrated circuit.

One important step in the process is bonding the terminal pins such that the pins make electrical contact with the conductive circuit pattern formed on the interconnect tape. This process is known as "staking". In the aforementioned U.S. Pat. No. 4,816,426 staking is accomplished by supplying a terminal pin having a pin shoulder with a diameter slightly larger than the diameter of the apertures in the interconnect tape. The pin head is inserted through the aperture such that the tape may subsequently be pinched between the pin head and shoulder. The pin is therefore held in place by mechanical means.

U.S. Pat. No. 4,965,227 discloses a process for bonding the terminal pins by soldering. The pins are provided with a shoulder having a diameter larger than the interconnect tape apertures. The pin head has a diameter smaller than or about equal to that of the apertures. The interconnect tape passes over the pin heads to rest on the pin shoulders. A solder paste is then applied to a surface of the interconnect tape. The interconnect tape and pins are then heated to a temperature sufficient to melt the solder thereby bonding the pins.

While staking and soldering are both acceptable processes, higher density pin bonding is achievable by the processes of the invention. Higher density pin bonding permits higher pin counts per given package area.

Another method to increase the pin count is disclosed in U.S. Pat. No. 4,677,526, issued to Muehling. This patent discloses high pin count plastic pin grid array packages formed by encapsulating a plurality of lead frames in plastic resin. The lead fingers are bent prior to encapsulation and serve as the terminal pins.

U.S. Pat. No. 4,724,472, issued to Sugimoto et al. discloses a ceramic multi-layer base structure with terminal pins on almost the entire back surface of the substrate.

These methods are not adaptable to the plastic pin grid array package discussed hereinabove. Until now, it has not been possible to achieve high density pin counts with such a package.

Conventional terminal pins used in plastic pin grid array packages are solid. A pin with a small hole, having a diameter on the order of from about 0.005 inches to about 0.010 inches, located along the axis of the pin would be preferred for certain automated operations. The hole is useful for automated alignment and positioning. The hole is further useful to control metal flow when the pin head is deformed.

Thin walled hollow pins have been produced. These pins have an inside diameter slightly smaller than the outside diameter so that the radius of the hole is greater than the wall thickness. Thick walled hollow pins are preferred for PPGA for increased structural strength.

Previous attempts to form thick walled hollow pins have not been successful. The prior process comprised drilling a small hole in the pin after forming or mechanically forging a pin from thick walled hollow tubing. A drill of the desired diameter is fragile. Failure of the drill is due to metal seizing or vibrations of the pin stock. Further, accurately positioning the drilled hole at the center of the pin head is difficult.

To overcome these disadvantages and to provide an improved terminal pin, the inventors have developed a thick walled terminal pin and a process to produce the pin. Improved methods to bond the terminal pins have also been developed.

Accordingly, a series of processes to provide for high density bonding of terminal pins to flexible circuits is claimed. The processes entail ultrasonic soldering, riveting, and laser welding. The problem of electrical shorting between pins encountered with conventional soldering techniques is avoided. A process is detailed for the manufacture of thick walled hollow pins from thick walled tubing. The process entails machining the tubing to size using an automated miniature lathe. After machining, one or both ends of the pin may be sealed.

It is an object of the invention to provide a process to form thick walled hollow pins having a hole positioned along the axis of the pin.

It is another object of the invention to provide a method of bonding terminal pins to an interconnect tape which will achieve a high pin density.

It is a further object of the invention to provide a method of ultra-sonic soldering to bond the pins.

It is an advantage of the invention that the soldering operation may be flux free.

It is another object of the invention to provide a method of riveting the pins.

It is a further advantage of the invention that the axial positioning of the hole provides for improved distortion of the pin head during riveting.

It is an object of the invention that a method of laser welding of the pins is provided.

It is a feature of the invention that only a portion of the outer diameter of the pin head is melted during laser welding.

A better understanding of the essential features of the invention will be obtained from the following specification and accompanying drawings.

Figure 1:
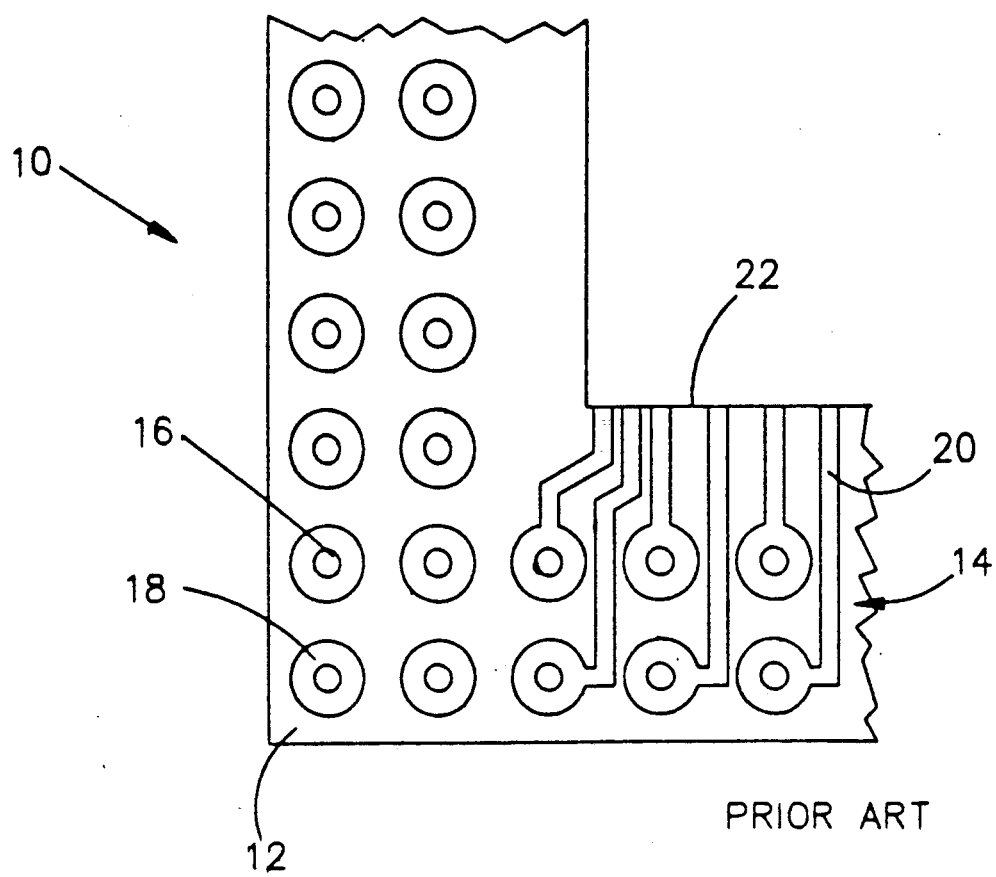
FIG. 1 illustrates an electronic circuit including conductive bonding pads for electrical bonding to the terminal pins.

FIG. 1 illustrates a portion of an electronic circuit 10 for use in plastic pin grid array packages as known from the prior art. The circuit 10 is comprised of a dielectric support layer 12 and a conductive layer 14. The circuitry may be rigid as for example a standard printed circuit board. Alternatively, the circuitry may be flexible as with a flexible interconnect tape or a tape adapted for tape automated bonding (TAB). For a flexible circuit, the dielectric support layer is typically a polyimide such as KAPTON. The conductive layer, typically copper or a copper alloy is bonded to the dielectric support layer. Bonding of the layers may be by lamination, adhesive or any other technique known in the art. Apertures 16 are provided through the dielectric support 12 and conductive 14 layers.

The conductive layer 14 is patterned into a plurality of circuit patterns by a technique known in the art, such as photolithography. The circuit patterns comprise conductive bonding pads 18 located concentrically about the apertures 16. A circuit trace 20 extends from each conductive bonding pad to an inside edge 22 of the circuit 10. The inside edge 22 is suitable for electrical connection to an electronic device by a technique such as wire bonding. By this means, the electrically conductive bonding pads 18 are electrically connected to the electronic device.

To simplify the embodiment shown in FIG. 1, only a limited number of circuit traces 20 are shown. It should be realized that all or most conductive bonding pads 18 are connected to circuit traces extending to the inside edge 22 of the circuit 10.

Figure 2:
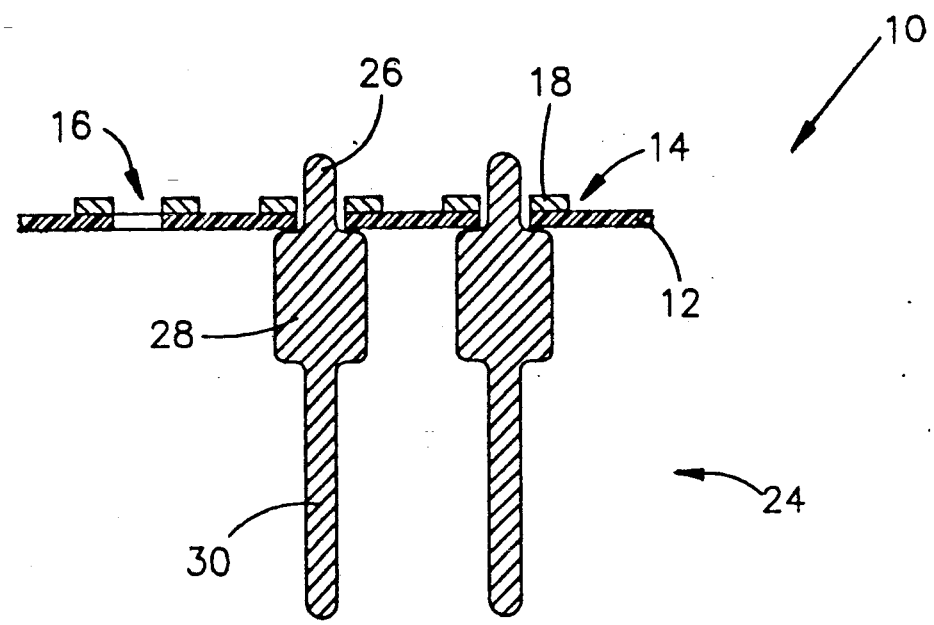
FIG. 2 shows in cross section the positioning of a terminal pin in relation to the flexible circuit and conductive bonding pad.

FIG. 2 illustrates the positioning of terminal pins relative to the circuit 10 as known from the prior art. The circuit comprises a dielectric support layer 12 and a conductive layer 14. At the area illustrated by FIG. 2, the conductive layer 14 is formed into a plurality of electrically conductive bonding pads 18. The bonding pad aperture 16 passes through both the dielectric support layer 12 and the bonding pad 18.

Terminal pins 24 are provided to electrically connect the bonding pads 18 to an external circuit. Through the circuit traces, the terminal pins and the external circuit are electrically connected to the electronic device. The terminal pins 24 comprise a pin head 26, a shoulder 28 and an insertion end 30. The diameter of the pin head 26 is small enough to pass through the aperture 16. The shoulder 28 diameter is larger than the aperture diameter so the circuitry 10 rests on the shoulder 28 of the pin 24. For optimal electrical operation, it is desired to firmly bond the pin to the conductive bonding pad 18. The bond between the pin and conductive layer must be electrically conductive with a minimum of internal electrical resistance.

Figure 3:
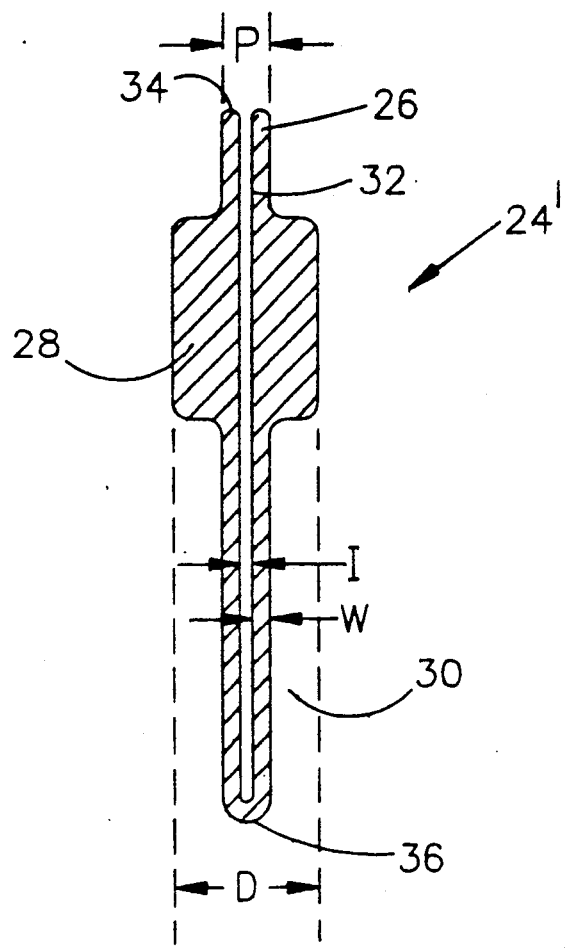
FIG. 3 shows in cross section a thick walled hollow pin in accordance with the invention.

FIG. 3 shows in cross section a thick walled hollow pin 24' in accordance with the present invention. The inventors have developed a process to produce the thick walled hollow pins at high speed and without collapse of the internal hole. The pin is an improvement over solid pins and permits a variety of bonding methods which are either impossible or inferior when used with conventional pins. These bonding methods are described in more detail hereinbelow.

The electrically conductive pin is cylindrical and includes a pin head 26 having a first diameter designated "P". The pin head diameter "P" is generally from about 0.015 inches to about 0.040 inches. A centrally positioned passageway 32 runs along the axis of the pin. The passageway has a second diameter, designated "I". The wall thickness, designated "W" is equal to:

$$W=(P-I)/2$$

The opposite end of the pin 24 comprises an insertion end 30. The axially positioned passageway 32 extends at least part way through the insertion end of the pin. Disposed between the pin head and insertion end is a shoulder 28. The shoulder has a third diameter, designated "D" which is greater than the first diameter "P". The axially positioned passageway extends through the shoulder 28.

The pin of the invention 24' includes a passageway 32. The passageway is open at the pin head and may be sealed at the insertion end 30. Sealing the insertion end is not required, but is desirable to prevent the introduction of contaminants to the plastic pin grid array package through the internal hole. The diameter of the passageway is minimized to maintain the structural strength of the pin. The diameter of the passageway is preferably less than about 0.015 inches and most preferably in the range of from about 0.005 inches to about 0.010 inches. The diameter of the pin is generally on the order of about 0.015 inches to about 0.040 inches such that the walls of the pin 24' are about 0.010 inches. The radius of the passageway 32 is less than the wall thickness of the pin as measured along the shoulder 28. The pin shoulder 28 has a diameter larger than the pin head 26 and is preferably from about 0.025 inches to about 0.060 inches and most preferably from about 0.030 inches to about 0.040 inches.

The pin is manufactured from any electrically conductive material which has good ductility. Any known terminal pin material may be used. Among the materials commonly used for terminal pins are copper and copper alloys, iron nickel alloys such as Alloy 42 and stainless steels. A preferred class of materials are those copper alloys known as phosphor bronzes. These materials have high tensile strengths to resist bending and electrical conductivities on the order of 20% of that of copper. A most preferred phosphor bronze is the alloy designated as copper alloy 510 which has the approximate composition of 95% by weight copper, 4.8% by weight tin and 0.2% by weight phosphorous.

The desired pin is fashioned from thick walled hollow tubing stock. The tube stock is formed by reducing a large diameter thick wall tube down to a desired diameter. The reduction process is known in the art and may be held to very tight tolerances. Techniques known as sinking and drawing are used. Both techniques draw the tube through a die to reduce the outside and inside diameter. Drawing incorporates a mandrel positioned inside the tube to accurately control inside diameters. Sinking does not use a mandrel. The tube is drawn to an outside diameter, designated "D" in FIG. 3 of from about 0.025 inches to about 0.060 inches. The diameter "D" is about equal to the desired diameter of the shoulder 28 of the pin 24'. The inside diameter, designated "I" is selected to be about equal to the desired diameter of the aperture, that is from about 0.005 inches to about 0.010 inches.

The tube is then machined on an automated lathe such as the TOR 4 sold by Tornos Bechler of Norwalk, Conn. The pin head 26 and insertion end 30 are turned down to a desired diameter so that the pin head is insertable into the aperture of the circuitry. The machined pin is removed from the tube stock by increasing the depth of the lathe cut at the pin head end 34 and the insertion tip 36 to cut the pin free.

The amount of metal removed from each pin is small and alignment of the tube for feeding into the lathe is quite simple. Large quantities of pins may be manufactured at reasonable prices. Alignment and feeding of tube stock is accomplished by guiding the tube feed stock by any conventional means.

Pins formed in accordance with the invention are charaterized by the axial passageway 32 being concentric with the pin head 26 and the shoulder 28. The concentric axial passageway provides for uniform deformation of the pin head during the various bonding processes.

As discussed hereinabove, the insertion tip 36 of the pin is preferably sealed to form a blind hole. If the interior passageway continues through the entire pin, contaminants may pass through the hole and enter the plastic pin grid array package. Sealing may be by mechanical means, such as forging. The end may also be sealed by deformation during cut-off of the pin from the tube stock following manufacture. Alternatively, the interior hole may be sealed by blocking the hole with a layer of a second material. A plug may be readily fashioned by any coating means such as electroplating.

Figure 7:
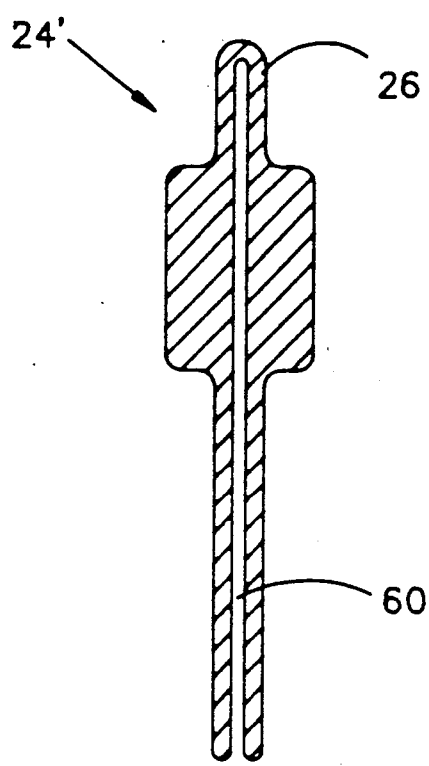
FIG. 7 shows in cross section a thick walled hollow pin in accordance with a second embodiment of the invention.
Figure 8:
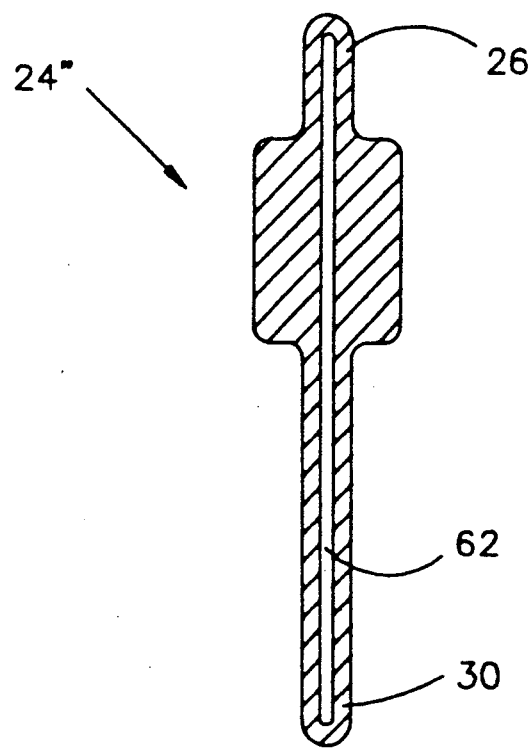
FIG. 8 shows in cross section a thick walled hollow pin in accordance with a third embodiment of the invention.

Only one end of the hollow pin must be sealed to prevent the flow of contamination. While FIG. 3 shows the insertion end sealed, a blind hole 60 formed by sealing the pin head end 26 of the pin 24' as illustrated in FIG. 7 will accomplish the same objective. Similarly, sealing both the pin head 26 and insertion end 30 of the pin 24" to form an enclosed cavity 62 as illustrated on FIG. 8 is acceptable.

The pin 24' of the invention has several advantages over conventionally formed pins. The hole at the pin head end 34 as shown in FIG. 3 serves as an alignment means for mechanical operations. A mechanical pick-up means, for example a robot, can pick up the pin and align it accurately using the small hole. This permits automated insertion of the pins at high speeds. The accurate positioning of the hole along the axis of the pin provides for uniform deformation around the circumference of the pin head 26 during riveting or welding as discussed hereinbelow.

Figure 4:
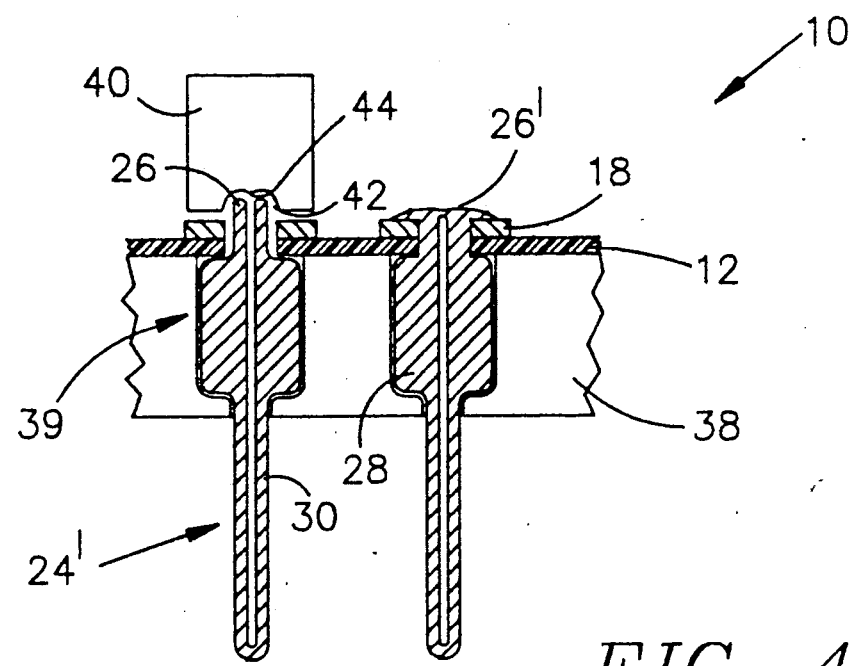
FIG. 4 shows a process for riveting terminal pins.

A prior art staking process discussed hereinabove comprises screening paste solder onto the electrically conductive pads and then heating the assembly so the pins are soldered to the electrically conductive pads. One disadvantage with the prior art process is that the solder paste may flow between electrically conductive pads or along the circuit traces resulting in a short circuit. Using the pins of the present invention permits riveting of the pins as shown in FIG. 4. An advantage with riveting the pins is no external bonding media is required. The danger of electrical shorts is reduced. The advantage is quite significant as pin count density increases and the bonding pads and traces are placed closer and closer together. It is quite common for the spacing between traces to be as small as 0.002 inches.

As shown in FIG. 4, the pins 24' and circuitry 10 are supported by a fixture 38. The fixture contains a plurality of recesses 39 shaped to conform to the shoulder 28 and insertion end 30 of the pins and positioned to align the pins in the circuitry. The fixture 38 may be any rigid material which withstands the repeated forces imparted by riveting. A preferred material for the fixture is a tool steel or a rigid polymer. The circuitry comprising the electronic circuit patterns and dielectric support layer 12 is placed over the pin heads 26 so the dielectric layer is resting on the pin shoulders 28. It is also within the scope of the invention to invert the circuit tape 10 such that the bonding pads 18 rest on the pin shoulders 26.

A transducer 40 deforms the pin head 26. The transducer contains a shallow circular depression 42 which has a pyramid shaped tab 44 at the apex. The depression controls metal flow during riveting. The tab increases the rate of outward metal flow and also leads to uniform deformation around the circumference of the pin head. The combination of tab and interior hole 32 also permits accurate automated alignment of the transducer 40.

Riveting is accomplished by rapidly and continuously striking the pin head with the transducer. The transducer is vibrated at an ultra-sonic frequency of from about 1 to about 50 kilocycles. The preferred frequency to vibrate the transducer is from about 30 kilocycles to about 40 kilocycles so that the transducer strikes the pin head from 30,000 to about 40,000 times per second. The vibrational stroke length is varied from about 0.001 inches to about 0.005 inches. It has been found that these parameters when applied to a pin head containing an accurately positioned axial hole deform the pin head in uniform mushroom pattern. The uniform pattern clinches the pin head 26' to the circuitry 10. The ultrasonically induced vibrations displace oxides which may form on the surfaces of the pin head and bonding pad promoting the formation of a lower electrical resistance bond between the two surfaces.

It is apparent that riveting using an ultrasonic transducer shaped in accordance with the invention as well as the pins of the invention provide a pin which is firmly staked and in good electrical contact with the electrically conductive pads.

This technique is not limited to the thick walled hollow pins of the invention, conventional solid pins may be satisfactorily riveted as well. Extra force and time may be required as more metal must be deformed. Also without the central hole, alignment is more difficult. A uniform mushroom shaped clinch is not readily obtained.

The invention is not limited to single head transducers 40 as shown in FIG. 3. Multiple head transducers capable of riveting a plurality of terminal pins simultaneously are also within the scope of the invention.

Welding is another technique improved by the use of thick walled hollow pins. Welding has an advantage over riveting as the proper combination of pin material and conductive bonding pad material leads to wetting of the bonding pad by a molten portion of the pin forming a fused metallurgical bond. Riveting does not insure a diffusion bond along the entire bond surface and microscopic voids may allow contamination to leach into the bond site increasing electrical resistance. Also, mechanical deformation of the pin head by riveting may lead to the introduction of stresses in the bond.

Figure 5:
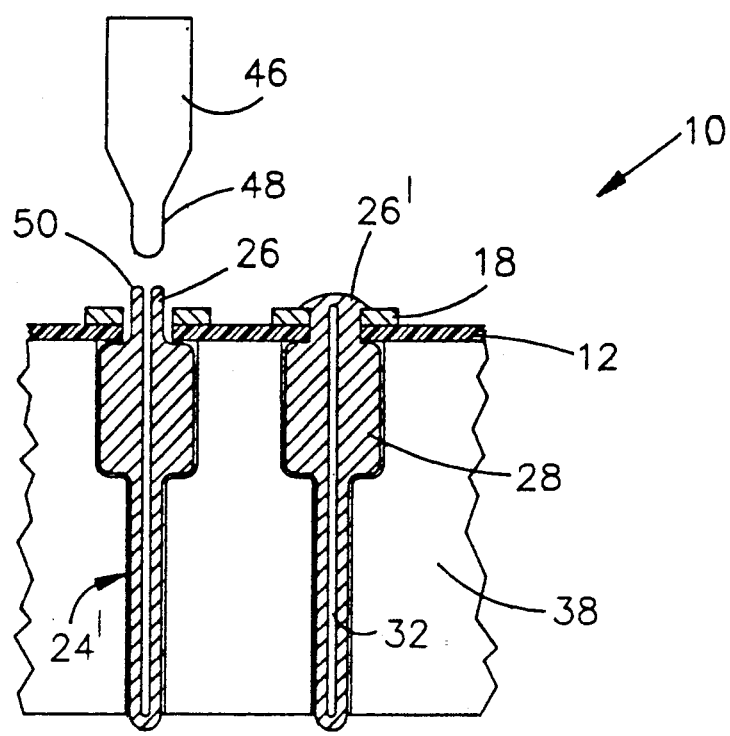
FIG. 5 shows a process for laser welding terminal pins.

FIG. 5 illustrates in cross section a process for welding terminal pins 24'. The pins with electronic circuitry 10 resting on the pin shoulders 28 as described hereinabove are placed in a fixture 38. A laser 46 generates a beam 48. The beam generates sufficient energy to melt at least a portion of the pin head. Either the entire pin head 26 or an annular portion of the outer circumference may be melted. The molten material flows wetting and fusing to the electrically conductive bonding pads 18. The molten material also collapses the pin head 26' sealing the hole 32.

Lasers capable of being focused to a hollow beam are preferred. The energy generated by the laser is concentrated along the circumference of the beam and little heat is generated in the center of the beam. By proper focusing of the laser, the low energy center area of the beam may be conformed to the diameter of the passageway 32. One exemplary laser uses a neodymium doped yttrium aluminum garnet ($Nd:Y_{ag}$) crystal. The laser operates at 1.06 micro-meter. The laser pulse rate is from about 8 nanoseconds to about 20 nanoseconds for a laser employing a cue switch. The pulse rate is from about 150 microseconds to about 500 microseconds if the cue switch is not employed. A preferred pulse rate range is from about 150 microseconds to about 250 microseconds.

Another satisfactory laser is based on $CO_2$ gas and operates at 10.6 micro-meter. The pulse rate of the $CO_2$ gas laser is similar to that for $Nd:Y_{ag}$ laser detailed above.

The laser is focused so the outer surface of the pin head 26 melts without heating the dielectric substrate 12 to a temperature above about 150° C. Above this temperature, the dielectric will be subject to thermal degradation. The focused beam 48 heats only the exterior surface 50 of the pin head 26. The exterior surface is rapidly heated to a temperature in excess of about 1000° C. melting the surface of the pin. Since the pin is preferably a good electrical conductor such as a copper alloy, it is inherently a good thermal conductor. By using a sufficiently large fixture 38 and manufacturing the fixture from a good conductor of heat, the heat conducted along the pin may be dissipated. A preferred material to manufacture the fixture is a tool steel.

The molten exterior surface flows to the electrically conductive bonding pad 18. Proper selection of the compositions of the pin and the bonding pads will result in the molten pin head fusing to the bonding pad creating a weld upon solidification. One preferred combination is a copper alloy 510 pin as described hereinabove and copper bonding pads.

Care must be taken to limit the amount of metal melted to avoid over heating the electrically conductive pad 18 which may result in degradation of the underlying dielectric layer 12.

The conductive pad 18 is also subject to oxidation when heated. Oxidation will interfere with the wetting of the bonding pad 18 and increase the electrical resistance of the bond. Oxidation may be inhibited by coating the bonding pads and/or the conductive traces with an oxidation resistant material such as gold which may be applied by any technique known in the art, such as electroplating. The terminal pins may also be coated with an oxidation resistant layer such as nickel, gold, tin or alloys thereof.

Joints formed by welding are superior to both soldered and riveted joints. The joints are less susceptible to solder fatigue and stress cracking. They are mechanically stronger than either soldered or riveted joints. The joint is formed from the pin material and is not as temperature sensitive as a solder based joint. The joints are less susceptible to corrosion than lead or tin based solder joints. The absence of any fluxes or lead or tin oxides produces a joint with lower internal electrical resistance than a joint containing these impurities.

As the joint is formed metallurgically rather than mechanically it is less stressed than a riveted joint. Contamination does not seep under the joint as may happen with a riveted joint.

Figure 6:
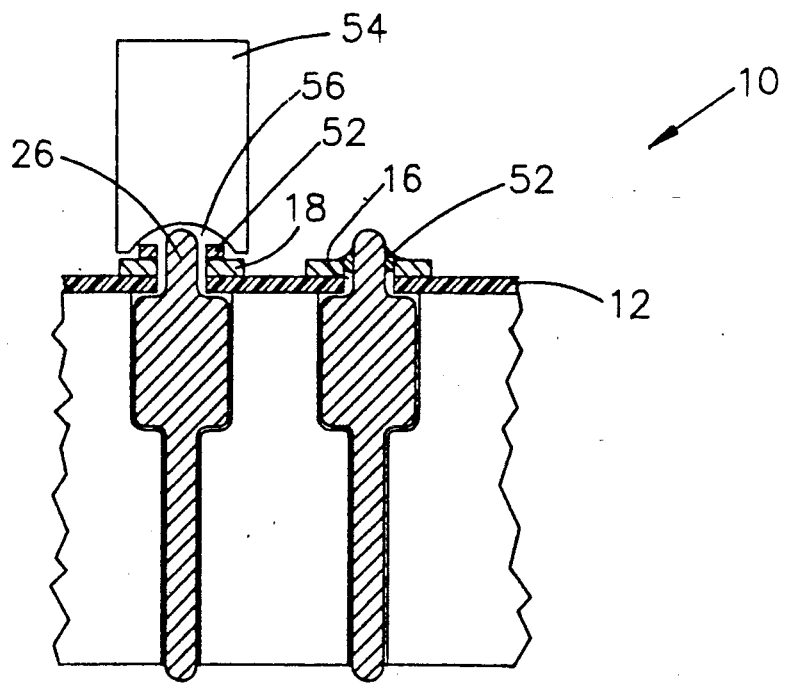
FIG. 6 shows a process for ultra-sonic soldering terminal pins.

The techniques discussed hereinabove for the thick walled hollow pins may be adapted to conventional pins as illustrated in FIG. 6. Soldering as a bonding means is greatly improved using the ultrasonic techniques of the invention. Less solder is required lessening the danger of solder bridging. Soldering may be flux free to prevent flux induced contamination.

A bonding agent 52, for example a solder, is positioned on the electrically conductive bonding pad 18. The bonding agent is applied and aligned by a technique known in the art. Screen printing of a paste solder or insertion of a washer shaped preform over the pin head 26 are two acceptable means.

An ultrasonic transducer 54 includes a conical depression 56 shaped to fit over the pin head 26 and to contact the solder 52. Heat and vibrational energy are supplied by the transducer. The solder is melted by thermal energy applied through the transducer, not by vibrational energy.

Heat may be concentrated by the transducer 54 at the solder - pin head interface. The dielectric layer 12 of the interconnect circuit 10 is heat sensitive and preferably not heated to temperatures above about 150° C. Concentrating the heat at the interface permits the use of higher melting point solders such as 95% by weight tin —5% by weight silver having a melting point in the range of from about 225° C. to about 240° C. The advantage of a higher melting temperature solders is a reduced danger of the solder joint weakening during subsequent processing or operational steps which require the addition of heat.

A second advantage achieved with the ultra-sonic transducer is an improved solder joint. The transducer 54 vibrates at a frequency in the range of from about 10 kilocycles to about 100 kilocycles. More preferably the transducer vibrates at a frequency of from about 30 kilocycles to about 40 kilocycles. The most preferred frequency is about 35 kilocycles. The vibrating transducer generates high frequency waves which freely pass through the molten solder. The waves cause cavitation, the formation of vapor filled bubbles or cavities, within the liquid. When these bubbles reach the solder - pin head interface, the bubbles collapse eroding the pin head surface. Cavitation induced erosion removes foreign materials and tarnish from the pin head surface permitting the formation of a solder joint without the necessity of a flux.

Besides cleaning the surface of the pin head 26, the ultrasonic transducer also increases the penetration ability of the molten solder 52. The solder penetrates the bonding pad aperture 16 spacing between the pin head and the conductive bonding pad 18 more readily than conventional solder flow techniques.

A mild flux such as rosin may be utilized to improve the solder bond between the pin head and the electrically conductive pad. In most plastic pin grid array applications flux is not desirable. It is difficult to ensure the complete removal of flux. Residual flux is an undesirable contaminant which adversely affects the electrical characteristics of the assembled package.

Using an ultrasonic transducer as described hereinabove, it has been found possible to achieve an exceptional bond between the electrically conductive pad 18 and the pin head 26 without flux.

The patents, patent applications and publications set forth in this application are incorporated by reference herein.

It is apparent that there has been provided in accordance with the present invention a terminal pin having an axial passageway and means to bond that pin or a conventional terminal pin to an interconnect tape which fully satisfy the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the claims.

We claim:

1. A cylindrical electrically conductive pin formed by the steps of drawing a tube through a die followed by machining on a lathe, comprising:
   a pin head;
   an insertion end; and
   a shoulder disposed between said pin head and said insertion end;
   said terminal pin having a relatively uniform diameter axial passageway forming a blind hole sealed at said insertion end extending from said pin head through at least a portion of said insertion end; and
   said pin head having a first diameter, said passageway having a second diameter of from about 0.005 to about 0.010 inches and said should having a third diameter wherein said second diameter is less than the difference between said third diameter and said second diameter.

2. The terminal pin of claim 1 wherein said first diameter is in the range of from about 0.015 inches to about 0.040 inches and said third diameter is in the range of from about 0.025 inches to about 0.060 inches.

3. The terminal pin of claim 2 wherein said second diameter is from about 0.005 inches to about 0.010 inches.

4. The terminal pin of claim 2 wherein said terminal pin is comprised of a material selected from the group consisting of copper, copper alloys, iron nickel alloys and stainless steels.

5. The terminal pin of claim 4 wherein said terminal pin is comprised of copper or a copper based alloy.

6. The terminal pin of claim 5 wherein said terminal pin is comprised of phosphor bronze.

7. The terminal pin of claim 6 wherein said terminal pin is comprised of an alloy containing about 4.8% by weight tin, 0.2% by weight phosphorous and the balance copper.

8. The terminal pin of claim 4 wherein said passageway is an enclosed cavity sealed at both said pin head and said insertion end.

* * * * *

UNITED STATES PATENT AND TRADEMARK OFFICE
CERTIFICATE OF CORRECTION

PATENT NO. : 5,046,971

DATED : September 10, 1991

INVENTOR(S) : Ruggiero, et. al.

It is certified that error appears in the above-identified patent and that said Letters Patent is hereby corrected as shown below:

Column 10, line 5, delete "should" and insert --shoulder-- in its place.

Signed and Sealed this

Twenty-third Day of February, 1993

Attest:

STEPHEN G. KUNIN

*Attesting Officer*     Acting Commissioner of Patents and Trademarks